United States Patent [19]

Wheatley, Jr.

[11] 3,723,833

[45] Mar. 27, 1973

[54] HEAT SINKING OF SEMICONDUCTOR INTEGRATED CIRCUIT DEVICES

[75] Inventor: Carl Franklin Wheatley, Jr., Somerset, N.J.

[73] Assignee: RCA Corporation

[22] Filed: July 19, 1971

[21] Appl. No.: 163,570

[52] U.S. Cl. ........317/234 R, 317/234 A, 317/234 N, 317/235 Q, 174/15

[51] Int. Cl. ..............................H01l 3/00, H01l 5/00

[58] Field of Search..................317/234 A, 234 D, 317/234 E, 234 G, 234 N, 235, 29; 29/589; 174/15

[56] References Cited

UNITED STATES PATENTS

| | | | |
|---|---|---|---|
| 3,387,113 | 6/1968 | Charbonnier | 317/234 |
| 3,393,328 | 7/1968 | Meadows et al. | 317/234 |
| 3,439,255 | 4/1969 | Carnes et al. | 317/234 |
| 3,611,061 | 10/1971 | Segerson | 317/234 |

*Primary Examiner*—John W. Huckert
*Assistant Examiner*—Andrew J. James
*Attorney*—Glenn H. Bruestle & H. Christoffersen

[57] ABSTRACT

A semiconductor device of the type in which a semiconductor chip is mounted on a lead assembly having a chip mounting portion, thermal conductors, and electrical conductors. The chip has some elements which generate heat, which are located in one zone of the chip, and others which are sensitive to spatial thermal gradients, which are located in a different zone of the chip. The chip mounting portion of the lead assembly has an area substantially free of spatial thermal gradients and the zone of the chip containing the sensitive elements is mounted adjacent to this area.

10 Claims, 2 Drawing Figures

INVENTOR.
Carl F. Wheatley, Jr.
BY
[signature]
ATTORNEY

HEAT SINKING OF SEMICONDUCTOR INTEGRATED CIRCUIT DEVICES

BACKGROUND OF THE INVENTION

This invention relates to semiconductor integrated circuit devices. It pertains particularly to a semiconductor device which includes means for dissipating heat generated by the device during its operation.

One known form of semiconductor device includes a semiconductor chip which is mounted on a so-called lead frame. The lead frame includes a central chip supporting pad, thermal conductors integrally related to the chip supporting pad, and a plurality of electrical conductors having inner terminal ends adjacent to the chip supporting pad. Connector wires extend between the electrical conductors and appropriate bonding pads on the chip. The chip, the connector wires, and the inner ends of the electrical conductors are encapsulated in a polymeric plastic body.

The trend in the art has been to add more and more functions to a single semiconductor chip. A chip may contain signal processing stages, power stages capable of driving equipment such as loudspeakers, and the like. Where stages which generate substantial quantities of heat have been included on the chip, thermal conductors have been provided, extending from the chip supporting pad of the device to the exterior of the plastic body where they can be coupled to a heat sink to extract the heat generated. Because of the spatial relationships of the power generating elements to each other and to those portions of the thermal conductors which are at lower temperatures, substantial spatial thermal gradients are often established in the device. Many of the active elements of a device may be sensitive to such spatial thermal gradients. For example, a device may include a stage having two transistors which must be at the same temperature for proper operation of the stage, such as two transistors connected as a differential amplifier. It would be desirable and of advantage to the art if those stages of a circuit which are sensitive to thermal gradients could be free of such gradients.

THE DRAWINGS

DETAILED DESCRIPTION

The present novel device is constructed in the same general manner as the known plastic encapsulated integrated circuit devices of the type described above. It differs from such devices in at least two material respects however, i.e., in the construction of its lead frame assembly and in the layout of the semiconductor chip and its placement in relation to the structure of the lead frame assembly.

Figure 1:
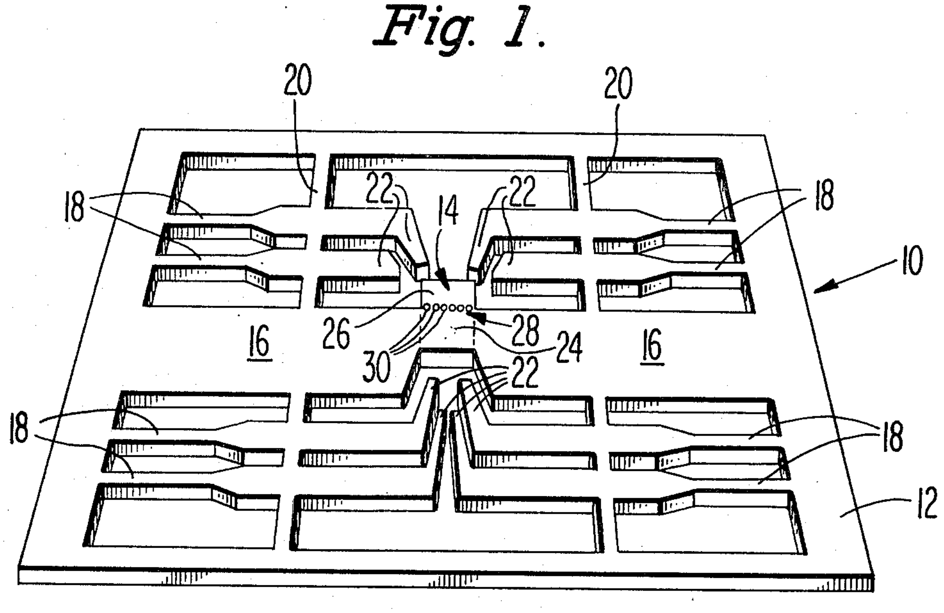
FIG. 1 is a perspective view of a unique lead frame useful in the manufacture of the present novel device.

A lead frame which is an intermediate element in the manufacture of the present novel device is indicated generally by the numeral 10 in FIG. 1. The lead frame 10 is generally similar to prior lead frames in that it is a flat plate including an outer frame-like portion 12, a central chip supporting pad 14, thermal conductors 16 integral with the chip supporting pad 14, and electrical conductors 18. Web elements 20 support the electrical conductors 18 in fixed predetermined relation to each other. The electrical conductors 18 have inner terminal ends 22 which lie near the chip supporting pad 14 and are adapted to have connector wires, not shown, bonded thereto in known fashion.

As illustrated in FIG. 1, the chip supporting pad 14 of the lead frame 10 includes a first portion 24 from which the thermal conductors 16 extend. The thermal conductors may be wider than the first portion 24 of the pad 14, as shown, and may be of other shapes. The chip supporting pad 14 also has a second portion 26 which is substantially thermally isolated, that is, the second portion 26 of the pad 14 does not communicate thermally with any point of substantially lower temperature over any appreciable distance. As shown, the portion 26 is generally rectangular, with three sides which will be totally surrounded by thermally insulating plastic material after the device is complete. The remaining side is somewhat thermally connected to the first portion 24 of the pad 14 which is normally at some higher temperature and, preferably, means for establishing a higher thermal resistance is included in the chip supporting pad 14 between the second portion 26 and the first portion 24. Even without such thermal resistance means, the second portion 26 of the pad 14 is substantially free of spatial thermal gradients because the configuration of the pad 14 limits heat flow to the first portion 24 and the thermal conductors 16. In the present example, the thermal resistance means is a zone 28 of reduced cross sectional area between the first portion 24 and the second portion 26 of the chip supporting pad 14. The reduced cross section may be achieved for example by providing a row of apertures 30 in the pad 14. Alternatively, the second portion 26 may be completely separate from the first portion 24. The lead frame should then include a temporary support for the second portion 26, similar to the supports 20 for the electrical leads 18.

Figure 2:
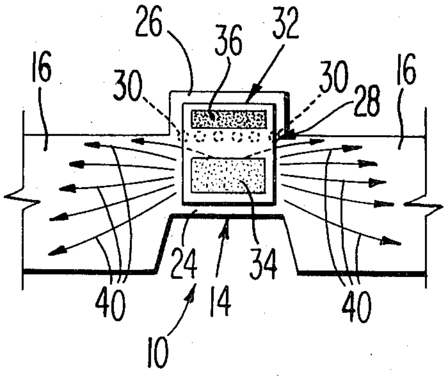
FIG. 2 is a diagramatic partial plan view of the semiconductor chip and lead assembly of the present novel device, illustrating the relationship of these elements.

FIG. 2 diagramatically illustrates a semiconductor chip 32 in place on the lead frame 10. The chip 32 is bonded to the lead frame 10 in conventional manner. Any circuit may be provided on the chip 32, and the details of the circuit are not shown. It is presumed however that the circuit has heat generating elements and elements which are sensitive to spatial thermal gradients as described above in the background of the invention.

The layout of the circuit on the chip 32 should segregate the heat generating elements from the thermal gradient sensitive elements. As shown in FIG. 2, the chip 32 has a first zone 34, indicated as a rectangular block with light stippling, and a second zone 36, indicated as a rectangular block with darker stippling. The heat generating elements of the circuit should be located in the zone 34, and the thermal gradient sensitive elements should be located in the zone 36. While the zone 34 has been shown as larger than the zone 36, the relative sizes of the zones is not material and will depend on the particular circuit.

In assembling the chip 32 onto the lead frame 10, the first zone 34 of the chip 32 should be placed adjacent to the first portion 24 of the chip supporting pad 14 and the second zone 36 of the chip 32 should be placed adjacent to the portion 26 of the chip supporting pad 14. In other words, the two zones 34 and 36 of the chip 32 should be on opposite sides of the row of apertures 30.

In the manufacture of a device in accordance with the present invention, after the assembly of the chip 32 onto the lead frame 10 in the manner described, the device is completed in known fashion. Connector wires are bonded between the chip and the terminal ends 22 of the leads 18, after which the entire assembly is encapsulated in a suitable plastic material. The outer frame portion 12 and the temporary support webs 20 of the lead frame are then removed and the device is essentially complete. The leads 18 may be bent into the so-called dual inline relationship if desired.

In the operation of the present novel device, the thermal conductors 16 are connected to an external heat sink and the electrical conductors 18 are connected to appropriate external circuitry. As the device operates, the heat generating elements in the first zone 34 of the chip 32 raise the temperature of the chip 32. Consequently, spatial thermal gradients are established between the first zone 34 and the cooler external heat sink. The gradients may be found along the lines of the heat flow from the chip 32, diagramatically suggested in FIG. 2 by the arrows 40. Because of the configuration of the lead frame 10 and the placement of the chip 32 thereon in the manner described, the second zone 36 of the chip 32 is effectively isolated, i.e., decoupled, from the spatial thermal gradients established during operation. Note that the temperature of the portion 26 of the pad 14 and the temperature of the zone 36 of the chip 32 may rise during operation of the device, because of conduction of heat through the chip 32 itself and through the thermal resistance means 28. Nevertheless, the zone 32 and all parts of the portion 26 will be substantially at the same temperature so that the portion 26 and the zone 36 are effectively free of spatial thermal gradients.

I claim:

1. A semiconductor device comprising a semiconductor integrated circuit chip having heat generating elements and elements which are sensitive to spatial thermal gradients, said heat generating elements being disposed in a first zone of said chip and said thermal gradient sensitive elements being disposed in a second zone of said chip, and means for supporting said chip, said means having a first portion for removing heat from said chip on which said first zone of said chip is disposed and a second portion on which said second zone of said chip is disposed, said second portion of said chip supporting means being substantially free of spatial thermal gradients.

2. A semiconductor device as defined in claim 1 further comprising thermal conductors extending from said first portion of said chip supporting means.

3. A semiconductor device as defined in claim 2 wherein said chip supporting means is a flat plate having a row of apertures therethrough, said first and second portions of said chip supporting means being portions of said plate on opposite sides of said row of apertures.

4. A semiconductor device as defined in claim 2 wherein said second portion of said chip supporting means is coupled to said first portion of said chip supporting means through thermal resistance means.

5. A semiconductor device as defined in claim 4 wherein said second portion of said chip supporting means is integral with said first portion of said chip supporting means, said thermal resistance means comprising a region between said first and second portions of said chip supporting means, said region having a cross sectional area substantially less than that of said first and second portions of said chip supporting means.

6. A semiconductor device comprising a semiconductor integrated circuit chip having heat generating elements and elements which are sensitive to spatial thermal gradients, said heat generating elements being disposed in a first zone of said chip and said thermal gradient sensitive elements being disposed in a second zone of said chip, and a lead assembly including a chip supporting pad, thermal conductors extending from said chip supporting pad, and a plurality of electrical conductors having ends disposed adjacent to said chip supporting pad, said chip supporting pad having a first portion thermally coupled to said thermal conductors and a second portion substantially thermally isolated from said thermal conductors, said integrated circuit chip being mounted on said chip supporting pad of said lead assembly with said first zone on said first portion of said chip supporting pad and said second zone on said second portion of said chip supporting pad.

7. A semiconductor device as defined in claim 6 wherein said chip supporting pad and said thermal conductors are integral and coplanar.

8. A semiconductor device as defined in claim 7 wherein said chip supporting pad has thermal resistance means between said first portion and said second portion thereof.

9. A semiconductor device as defined in claim 8 wherein said thermal resistance means is a region between said first and second portions of said chip supporting pad having a cross sectional area substantially less than that of said first and second portions of said chip supporting pad.

10. A semiconductor device as defined in claim 8 wherein said thermal resistance means is a plurality of apertures through said chip supporting pad between said first portion and said second portion thereof.

* * * * *